United States Patent [19]

Sakai et al.

[11] Patent Number: 4,920,401
[45] Date of Patent: Apr. 24, 1990

[54] BIPOLAR TRANSISTORS

[75] Inventors: Tetsushi Sakai, Sayama; Yoshizi Kobayasi; Hironori Yamauchi, both of Tokyo; Yoshinobu Arita, Hoya, all of Japan

[73] Assignee: Nippon Telegraph & Telephone Public Corp., Japan

[21] Appl. No.: 710,950

[22] Filed: Mar. 14, 1985

Related U.S. Application Data

[63] Continuation of Ser. No. 524,470, Aug. 19, 1983, abandoned, which is a continuation of Ser. No. 158,784, Jun. 12, 1980, abandoned, which is a continuation of Ser. No. 898,074, Apr. 20, 1978, abandoned.

[30] Foreign Application Priority Data

Apr. 25, 1977 [JP] Japan .................................. 52-46737

[51] Int. Cl.$^5$ ..................... H01L 29/72; H01L 29/34; H01L 29/04; H01L 23/48
[52] U.S. Cl. ........................................ 357/59; 357/34; 357/54; 357/71
[58] Field of Search ..................... 357/34, 36, 54, 59, 357/73, 71

[56] References Cited

U.S. PATENT DOCUMENTS

| | | | |
|---|---|---|---|
| 3,896,473 | 7/1975 | DiLorenzo et al. | 357/15 |
| 3,925,880 | 12/1975 | Rosvold | 357/71 |
| 3,945,030 | 3/1976 | Seales | 357/54 |
| 4,531,282 | 7/1985 | Sakai et al. | 357/34 |

Primary Examiner—J. Carroll
Attorney, Agent, or Firm—Charles W. Helzer; Ira C. Edell

[57] ABSTRACT

In a bipolar transistor, around the border line of the surface of a base region formed on a semiconductor substrate is formed a base electrode having a constant width of less than one micron and made of polycrystalline silicon. An island shaped emitter region is formed in the base region and an emitter electrode is formed on the surface of the emitter region. The emitter electrode is electrically isolated from the base electrode by an insulating film extending between the periphery of the emitter region and the base electrode.

6 Claims, 5 Drawing Sheets

BIPOLAR TRANSISTORS

This application is a continuation of application Ser. No. 524,470, filed Aug. 19, 1983, now abandoned, which is a continuation of application Ser. No. 158,784, filed June 12, 1980, now abandoned, which is a continuation of application Ser. No. 898,074 filed Apr. 20, 1978, now abandoned.

BACKGROUND OF THE INVENTION

This invention relates to a semiconductor device, more particularly a bipolar transistor and a method of manufacturing the same.

Transistors of this type having various constructions have already been proposed. The arrangement and construction of their electrodes are more or less limited due to problems involved in the method of manufacturing. Due to these problems, miniaturization, improvement of the characteristics of such transistors and increase in the density of integrated circuits are precluded.

According to a typical method of fabricating a bipolar transistor, for example a NPN transistor, a P type base diffusion region is formed on a N type monocrystalline silicon substrate by using a well known photolithographic process and diffusion technique and then an emitter diffusion opening is formed through a silicon oxide film overlying the base diffusion region by a conventional photolithographic process. Then, a N type impurity is diffused through this opening to form an island shaped emitter region in the base region. Thereafter a base contact opening is formed by photolithographic process and an emitter electrode and a base electrode are formed in the base contact opening and the emitter diffusion opening respectively. In this manner, a conventional transistor is fabricated but this method involves the following problems.

Firstly, it is necessary to align the relative positions of four photolithographic processes of forming the base diffusion opening, the emitter diffusion opening, the base contact opening and the base and emitter electrodes in the base region. To manufacture an extremely small transistor the accuracy of these position alignment and the accuracy of these portions must be extremely high thereby decreasing the yield of satisfactory products.

If one tries to increase the yield by sacrificing the accuracy of the position alignment and the accuracy of working, the area of the base region (except the portion thereof immediately beneath the emitter region) becomes much larger than that of the emitter region thereby increasing the collector-base junction capacitance and the base resistance thereby degrading the characteristics of the transistor.

Although it has been proposed to use the base diffusion opening as a portion of the emitter region for the purpose of increasing the integrating density, the base surface concentration decreases near the outer boundary of the base region opposing the silicon oxide film thus resulting in leakage current between the collector and emitter electrodes due to the surface N type inversion caused by the contamination of the silicon oxide film. To obviate this problem it has been proposed to provide a P+ region near the outer boundary of the base region. However, when this P+ region is formed by photolithographic technique, and when a small transistor is formed, the area of the base region except for the portion thereof just beneath the emitter region increases due to the position alignment thus deteriorating the characteristics of the transistor.

SUMMARY OF THE INVENTION

Accordingly, it is the principal object of this invention to provide an improved bipolar transistor and a method of manufacturing the same capable of decreasing the collector-base junction capacitance, and capable of miniaturizing the transistor without increasing the base capacitance thereby improving the yield.

Another object of this invention is to provide an improved bipolar transistor and a method of manufacturing the same which has a small size so that it is suitable for use in an integrated circuit having a high integrating or packing density.

Still another object of this invention is to provide a method of manufacturing a bipolar transistor wherein the base and emitter regions, base electrode and the lead thereof are formed using only a single precision photomasking operation.

A further object of this invention is to provide a novel method of manufacturing a bipolar transistor capable of decreasing the distance between the emitter region and the base electrode and the width of the base contact to small values, that is less than one micron.

According to one aspect of this invention there is provided a bipolar transistor comprising a semiconductor substrate, a base region formed on the substrate, a base electrode made of polycrystalline silicon and surrounding the entire periphery of the boundary of the base region with a substantially constant width, an island shaped emitter region formed in the base region, an emitter electrode formed on the surface of the emitter region, and an insulating film electrically isolating the base electrode from the emitter electrode.

According to another aspect of this invention, there is provided a method of manufacturing a bipolar transistor comprising the steps of forming a first insulating film on a semiconductor substrate of one conductivity type, forming a second insulating film doped with an impurity of a second conductivity type on the first insulating film, forming an opening through the first and second insulating films, forming an ion implanted region at a portion of the semiconductor substrate exposed in the opening by using the opening as a mask, forming a non-doped polycrystalline silicon layer on the surface of the semiconductor substrate, heat treating the substrate to diffuse the impurity from the second insulating film so as to form a diffused region doped with the impurity of the second conductivity type around a region insulated by the insulating films on the substrate and to convert a portion of the polycrystalline silicon layer not overlying the insulated region into a region diffused with the impurity of the second conductivity type, removing a non-doped polycrystalline silicon layer on the insulated region, forming a third insulating film on the surface of said semiconductor substrate, forming a base and emitter diffusing opening through a portion of the third insulating film in the first mentioned opening, forming a base region on the semiconductor substrate through the diffusing opening the base region being contiguous to the region diffused with the impurity of the second conductivity type, forming in the base region an island shaped emitter region of the first conductivity type, and vapor-depositing a metal layer to form base and emitter electrodes, the metal layer being contiguous with a portion of the polycrystalline silicon layer diffused with the impurity of the second conductivity type and a portion of the emitter region.

According to a modified form of this invention there is provided a method of manufacturing a planar type bipolar transistor comprising the steps of forming a first insulating film on a semiconductor substrate of a first conductivity type, forming a first opening through the first insulating film, forming a polycrystalline silicon layer doped with an impurity of a second conductivity type to cover the surface of the semiconductor substrate, forming second and third insulating films having different insulating characteristics on the polycrystalline silicon layer, forming a second opening through the second and third insulating films, etching the polycrystalline silicon layer by utilizing the second opening as a mask such that said polycrystalline silicon layer is side-etched so as to form a base diffusion opening, forming a region of second conductivity type by diffusing an impurity of the second conductivity type through the base diffusion opening and by diffusing the impurity from the polycrystalline silicon layer adjacent the semiconductor substrate, forming a fourth insulating film on an exposed portion of the semiconductor substrate and on the polycrystalline silicon layer, implanting ions to form an ion-implanted insulating film region and an ion-nonimplanted insulating film region in exposed portions of the second and third insulating films by utilizing the opening as a mask, removing the ion-implanted insulating film region, forming a base region by diffusing an impurity of the second conductivity type through the base diffusion opening and by diffusing the impurity from the polycrystalline silicon layer adjacent the semiconductor substrate, forming an emitter region of the first conductivity type in the base region on the semiconductor substrate through the base diffusion opening, and vapor-depositing a metal layer to form base and emitter electrodes, the metal layer being contiguous with the polycrystalline silicon layer and with a portion of the emitter region.

According to another embodiment of this invention there is provided a method of manufacturing a planar type bipolar transistor comprising the steps of forming a first insulating film on a semiconductor substrate of one conductivity type, forming a first opening through the first insulating film, forming a polycrystalline silicon layer doped with an impurity of a second conductivity type to cover the surface of the semiconductor substrate, forming second and third insulating films having different insulating characteristics on the polycrystalline silicon layer, forming an opening through the second and third insulating films, etching the polycrystalline layer by utilizing the opening as a mask such that the polycrystalline silicon layer is side-etched so as to form a base diffusion opening, forming an ion-implanted region in a portion of the semiconductor substrate exposed in the opening, heat oxidizing the semiconductor substrate to form on the ion-implanted region an oxide film having a thickness smaller than other portions and to diffuse the impurity from the polycrystalline silicon layer adjacent the semiconductor substrate so as to form a region of the second conductivity type, removing the oxide film on the ion-implanted region, diffusing an impurity of the second conductivity type through the base diffusion opening to form a base region, forming an island shaped emitter region of the first conductivity type in the base region, and vapor-depositing a metal layer to form base and emitter electrodes, the metal layer being contiguous with the polycrystalline silicon layer and with a portion of the emitter region.

BRIEF DESCRIPTION OF THE DRAWINGS

In the accompanying drawings:

FIG. 1M is a sectional view, and diagrammatic top planar view keyed thereto, showing certain dimensional characteristics of the bipolar transistor of this invention;

DESCRIPTION OF THE PREFERRED EMBODIMENTS

Figure 1A:
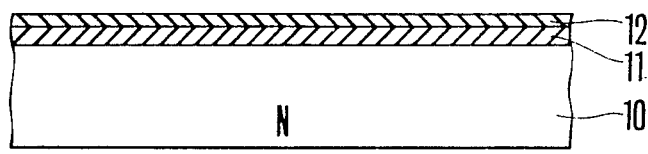
FIGS. 1A through 1L are sectional views showing successive steps of one example of the method of manufacturing a bipolar transistor according to this invention.

According to the method of this invention, as shown in FIG. 1, a N type monocrystalline silicon substrate 10 having an impurity concentration that provides a resistivity of about 1 ohm-cm, is prepared. Then, a silicon oxide ($SiO_2$) film 11 having a thickness of about 0.4 microns is formed on the surface of the substrate 10 by thermal oxidation method, for example. A second silicon oxide film 12 having a thickness of about 0.2 microns and containing boron at a high concentration, for example about 8-10 mol % is formed on the surface of the silicon oxide film 11, as shown in FIG. 1A, by CVD (chemical vapor deposition) method. Then, as shown in FIG. 1B, a photoresist film 13, for example AZ-1350 (trade mark), having a thickness of about 0.8 microns is applied onto the silicon oxide film 12 and thereafter an opening 14 is formed through the oxide films 11 and 12 by conventional photolithographic etching process. As can be noted from FIG. 1B, a undercut or side etching $l_1$ of about 0.3-1 microns also takes place at this time.

Figure 1B:
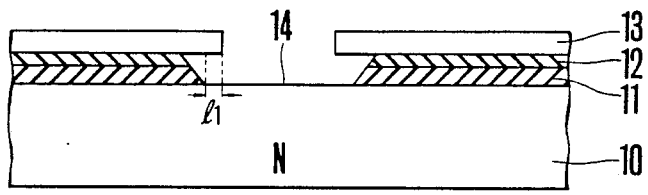
Figure 1C:
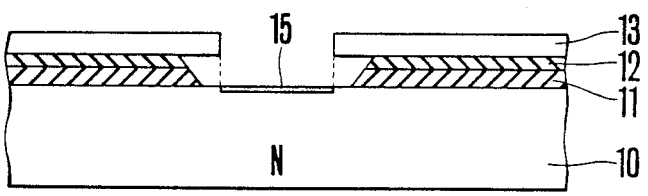

Then as shown in FIG. 1C, without removing the photoresist film 13 nitrogen atoms $N_2^+$ are implanted through the opening 14 by ion implantation silicon nitride method to form a nitrogen ion-implanted region 15 in the surface of the substrate 10. It is to be understood that a silicon nitride film or a polycrystalline silicon film may be substituted for the photoresist film 13. The depth of nitrogen implantation is very small, less than 0.1 micron for example, and the quantity of the implanted nitrogen should be sufficient to form the silicon nitride region 15, for example a dose of $N_2^+$ of about $3 \times 10^{16}$ atoms/cm$^3$ at an implantation voltage of 30 to 40 KeV. As will be described later, the depth of ion implantation is determined such that the ion-implanted region 15 can prevent oxidation so that it is desirable that the ion-implanted region 15 be formed near the surface of the substrate as far as possible.

Figure 1D:
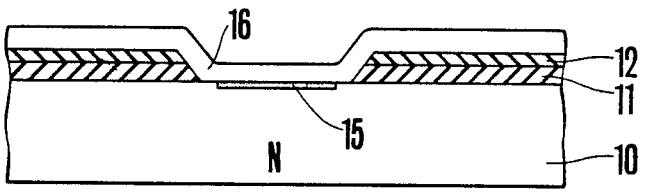
Figure 1E:
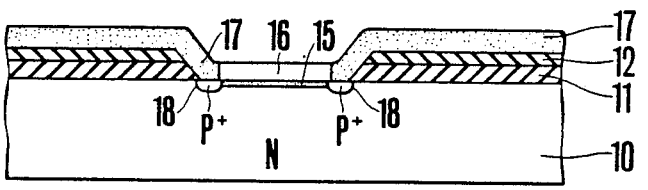

Then, as shown in FIG. 1D, after removing the photoresist film 13, a non-doped polycrystalline silicon layer 16 is formed on the exposed surface by CVD process, for example, to a thickness of about 0.4 microns. The polycrystalline silicon layer 16 is in direct contact with the surface of the substrate in the opening 14. Then, as shown in FIG. 1E, boron is diffused by heat treatment into the polycrystalline silicon layer 16 and into the substrate from the boron containing silicon oxide film 12 to form the portion of the boron containing polycrystalline silicon region 17 and a boron diffused P+ region 18 in the monocrystalline silicon substrate 10 around the opening 14 for forming diffused base region. A width $l_2$ of the P+ polycrystalline silicon region 17 in contact with the P+ region 18 is about 0.3 to 1 μm. The conditions of heat treatment are 900° to 1000° C. and 20 to 30 minutes, for example. Each of the polycrystalline silicon region 17 and the P+ region 18 contains boron of more than $5 \times 10^{19}$ atoms/cm$^3$.

Figure 1F:
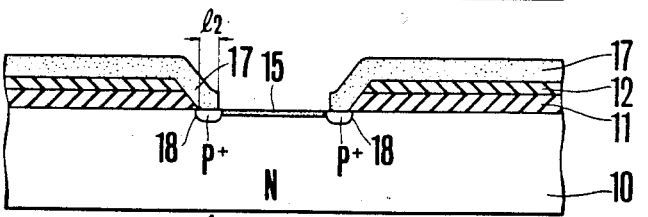

The polycrystalline silicon regions 16 and 17 are then etched with an alkaline etching solution to result in the structure shown in FIG. 1F. The etching speed is much faster at the non-doped polycrystalline silicon film than the boron doped polycrystalline silicon film. For example, where a KOH solution is used as the etching solution, the etching speed of the non-doped polycrystalline silicon film is about 3 to 10 times faster than that of the boron doped polycrystalline silicon film.

Figure 1G:
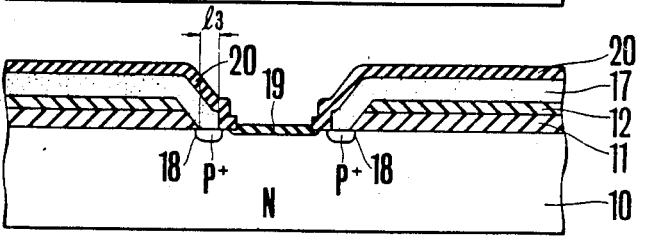

Then, as shown in FIG. 1G, by heat oxidation silicon oxide films 19 and 20 are formed on the surface of the boron doped polycrystalline silicon region 17 and the exposed surface of the nitrogen ion implanted region 15 of monocrystalline silicon substrate 10, respectively. The heat oxidation process is carried out in an atmosphere of wet oxygen, for example, at a temperature of 1000° C. for 60 minutes. The oxidation speed of the nitrogen ion-implanted region 15 is lower than that of the boron doped polycrystalline silicon region 17. For this reason, an extremely thin oxide film 19 having a thickness of less than 0.1 micron is formed on the surface of the nitrogen ion-implanted region 15 whereas the silicon oxide film 20 having a larger thickness of about 0.35–0.5 microns is formed on the surface of the boron doped polycrystalline silicon region 17. At this time, oxidation is continued until all of the nitrogen ion-implanted region 15 shown in FIG. 1F is oxidized. In this case, the width $l_3$ of the P+ polycrystalline silicon region 17 in contact with the P+ region 18, although varying with the thickness of the silicon oxide film 20 and the time of the heat oxidation process, has a value of about 0.05 to 0.8 μm.

Figure 1H:
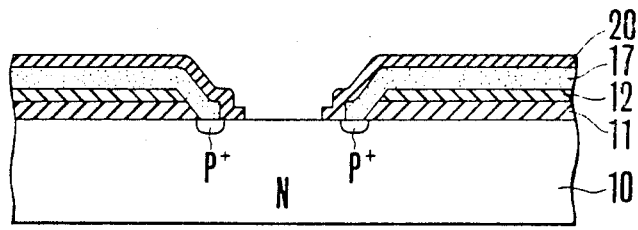

Then, as shown in FIG. 1H, the silicon oxide film 19, which was previously the nitrogen ion-implanted region 15, is removed. The silicon oxide film 19 is thinner than the silicon oxide film 20 on the polycrystalline silicon film 17 so that when the assembly is etched under the etching conditions necessary to remove the silicon oxide film 19 the silicon oxide film 20 on the boron doped silicon region 17 and on the portion near this film would remain at a thickness of about 0.25 microns as shown in FIG. 1H. Although the oxide film 20 slightly extends into the monocrystalline silicon substrate 10 and these portions are also removed, such extended oxide film is not shown.

Figure 1I:
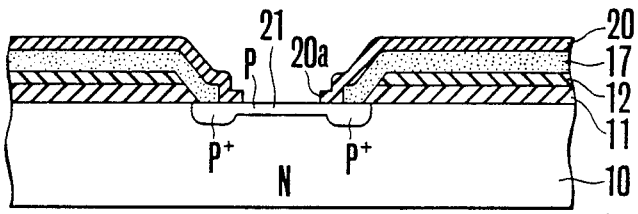

Then, as shown in FIG. 1I, a base region 21 doped with a P type impurity is formed on the surface of the substrate 10 by diffusing the P type impurity through the base-emitter diffusion opening 20a by well known vapor phase diffusion method, solid phase diffusion method or ion implantation method. The base region 21 is formed so as to include therein the P+ region 18 formed by the step shown in FIG. 1E and that the thickness of the base region 21 at the P+ region 18 is larger than that of the diffused layer formed by diffusing the impurity through opening 20a.

Figure 1J:
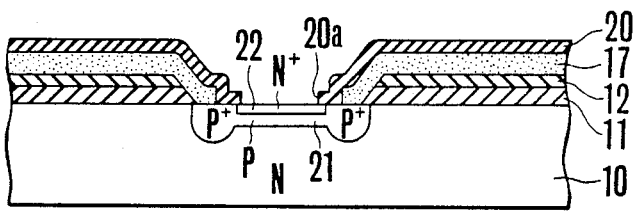

Then, as shown in FIG. 1J, an emitter region 22 doped with a N type impurity is formed by diffusing the N type impurity through the opening 20a by well known vapor phase diffusion method, solid phase diffusion method or ion implantation method.

Figure 1K:
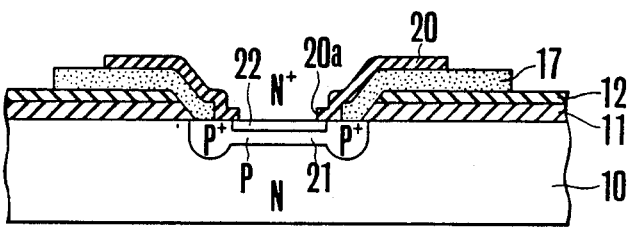

Then, as shown in FIG. 1K, unnecessary portions of the polycrystalline silicon film 17 and the silicon oxide film 20 thereon are removed by conventional photolithographic process. Since the emitter and base junctions essential to the operation of the transistor have already been formed it is not necessary to rely upon highly accurate photolithographic technique.

Figure 1L:
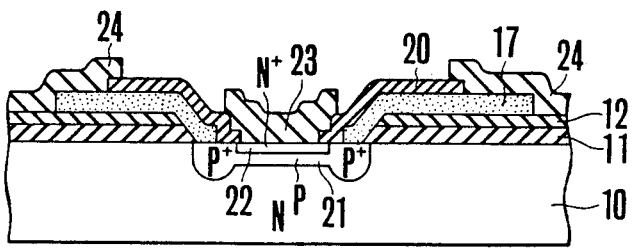

Then, as shown in FIG. 1L electrode metal is vapor-deposited and unnecessary portions thereof are removed by conventional photolithographic process for forming an emitter electrode 23 and a base electrode 24.

Figure 2:
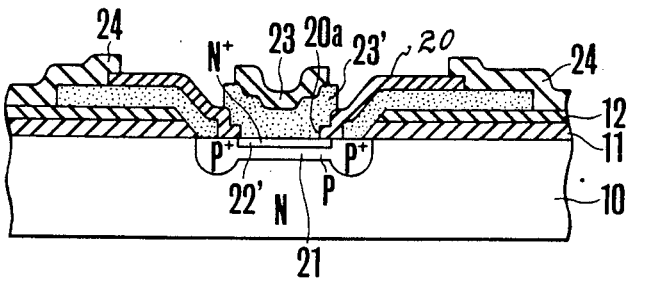
FIG. 2 is a sectional view showing a modified step.

Alternatively, as shown in FIG. 2, a polycrystalline silicon layer 23' doped with a N type impurity and acting as a source of the N type impurity may be formed to close the opening 20a and to partialy overlie the silicon oxide film 20. With this modified method it is possible to use the polycrystalline silicon layer 23' as the emitter electrode or a portion thereof after forming the emitter region. Although in FIG. 2, a metal layer 23 is vapor deposited on the polycrystalline silicon layer 23' such metal layer may be omitted.

The transistor and the method of manufacturing the same described above have the following advantages.

As noted above, the present invention has as one important feature, the polycrystalline base electrode 17 arranged to form a constant width connection band entirely around the outer peripheral portion 18 of the top planar side of the base region 21. In addition, the island-shaped emitter region 22 formed in the base region 21 is spaced apart a constant predetermined distance from the constant width connection band, entirely around the inner periphery of the constant width connection band.

In order to better illustrate the constant width connection band, and the spacing apart of the island-shaped emitter region a constant predetermined distance from the constant width connection band, reference is made to FIG. 1M. Projected below cross sectional view of the device is a diagrammatic top planar view of the partially finished device showing the emitter contact region, the base contact region and the two constant width distances described above and identified as W1 and W2. W2 is the constant width connection band of the polycrystalline silicon layer 17 to the outer peripheral edge portion of the top planar side of the base region 21. W1 is the constant predetermined distance between the outer peripheral edge of the island-shaped emitter region 22 and the inner periphery of the constant width connection band.

(1) Since a polycrystalline base electrode having a predetermined width is formed close to the boundary of the base surface region to encircle the same it is possible to decrease the capacitance of the base-emitter junction.

(2) Moreover, as the base electrode is formed at a predetermined distance from the emitter region, it is possible to decrease the base resistance.

(3) According to the method of this invention, once the base pattern is determined as shown in FIG. 1B and succeeding figures, essential elements of the transistor contained in the base region are automatically aligned in the succeeding steps so that it is not necessary to use a photomask before the base electrode is formed. Consequently, the width of the base surface region is determined by the extent of the undercut etching of the silicon oxide films 11 and 12 shown in FIG. 1B thus making it possible to limit the width to be less than one micron. For example, where a transistor provided with an emitter electrode having a minimum size of 2 microns, a position aligning accuracy of ±1 micron and an area of $2\mu \times 2\mu = 4$ square microns, is manufactured by a prior art method, the distance between the base contact having an area of $2 \times 2$ square microns and the emitter electrode should be 4 microns when the overlapping of the contact opening and the electrode is determined to be 1 micron by taking into consideration the position alignment accuracy. Further, when the position alignment accuracy is considered, the emitter and the base contacts should be formed at an inner portion 2 microns spaced from the periphery of the base electrode so that the base area should be $6\mu \times 12\mu = 72$ square microns.

On the otherhand, in the transistor of this invention, if the extent of the undercut of the silicon oxide films 11 and 12 were made to be 0.5 microns, since the patterns formed in the base region are automatically aligned the area of the base would be only about $3 \times 3 = 9$ square microns.

For the reason described above, the base area of the transistor of this invention can be reduced to $\frac{1}{8}$ of that of the prior art transistor having the same emitter area so that the collector-base junction capacitance decreases proportionally. Moreover as the base electrode is in contact with the entire periphery of the base surface region, it is possible to reduce the base resistance thereby improving the characteristics of the transistor.

The result of our experiment showed that the switching speed was increased twice by the decrease in the junction capacitance described above, Moreover, as it is possible to determine the emitter base junction and the collector-base junction by using a single photomask, it is easy to produce transistors including base or emitter regions having any desired patterns as shown in FIGS. 6A through 6F thus increasing the freedom of design. Where an extremely small photomask of the order of $2 \times 2$ square microns is used, a circular pattern can be obtained due to interference of light. With the prior art planar construction it has been difficult to manufacture such miniature transistor due to the problem of aligning the position, whereas according to this invention such small transistors can be manufactured very easily with high yield.

The advantage described in item 3 of the preceeding paragraph produces a remarkable merit in integrated injection logics ($I^2L$) in which transistors are used in a reverse operation, because the operating speed of $I^2L$ can be increased as the ratio of the emitter area to base area approaches unity. In other words, because it is necessary to remove as far as possible unnecessary base surface region. According to this invention it is possible to limit the base width to less than 0.5 microns by precisely controlling the amount of undercut. When the invention is applied to a diode array of transistor construction, it is possible to produce a fine diode array having extremely small parasitic capacitance without relying upon high accuracy working.

Figure 3A:
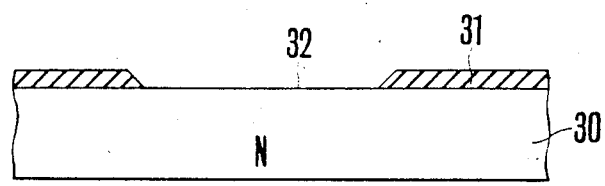
FIGS. 3A through 3F are sectional views showing successive steps of a modified method of manufacturing a bipolar transistor according to this invention.

FIGS. 3A through 3F show successive steps of a modification of this invention. As shown in FIG. 3A, a monocrystalline silicon substrate 30 having a resistivity of one ohm-cm is prepared, and a silicon oxide film 31 having a thickness of about 0.5 microns is formed on the substrate by conventional heat oxidation method, CVD method, etc. Then an opening 32 is formed through the silicon oxide film 31 by conventional photolithographic technique.

Figure 3B:
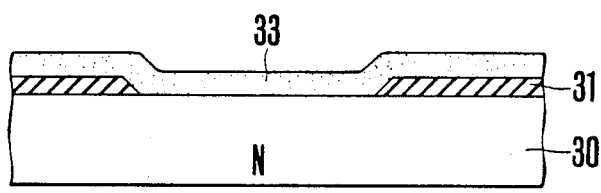

Then, as shown in FIG. 3B, a boron doped polycrystalline silicon layer 33 having a thickness of about 0.5 microns is formed on the silicon oxide film 31. The concentration of the doped boron is about $10^{19}$–$10^{21}$ atoms/cm$^3$. As can be noted from FIG. 3B, the polycrystalline silicon layer 33 is in direct contact with the surface of the substrate within the opening 32.

Figure 3C:
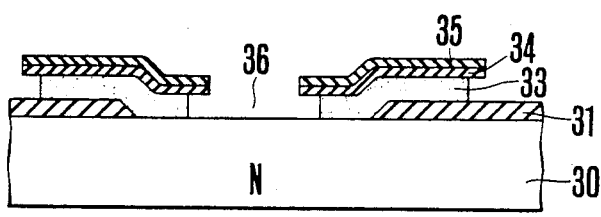

Then as shown in FIG. 3C, a composite layer comprising a silicon oxide film 34 and a silicon nitride film 35 is formed on the boron doped polycrystalline silicon layer 33 by CVD process or the like and then these films 34 and 35 are worked into the shape of a base electrode by conventional photolithographic technique. Then by using these insulating films 34 and 35 as a mask, the polycrystalline silicon layer 33 is etched with a suitable etching solution such as a KOH solution such that the polycrystalline silicon layer 33 is undercut, thereby forming an opening 36 for base diffusion. The extent of the under-cut is about 0.3 to 1 micron. At this time, the other portions of the polycrystalline silicon layer 33 are etched according to a predetermined pattern.

Figure 3D:
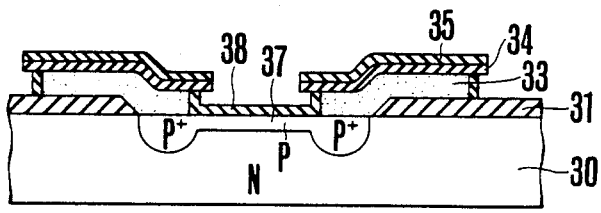

Thereafter, as shown in FIG. 3D, boron is diffused into the substrate 30 by conventional vapor phase diffusion method, solid phase diffustion method, etc., to form a base diffusion region 37. In the case of the vapor phase diffusion method, a silicon oxide film 38 having a thickness of 0.1 to 1 micron is formed at the time of heat treatment. In the case of solid phase, solid phase diffusion method, a boron doped silicon oxide film 38 is formed by CVD method and then the film is heat-treated in $N_2$ atmosphere to diffuse boron.

Figure 3E:
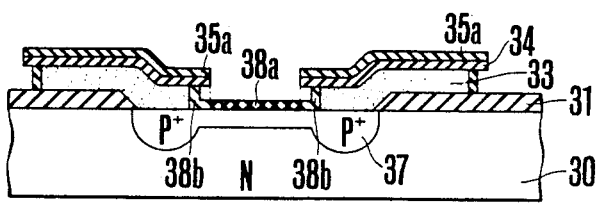

Then, as shown in FIG. 3E, ions of argon, boron, arsenic, phosphorus or nitrogen are implanted in a direction perpendicular to the surface of the substrate to form ion implanted insulating film regions 35a and 38a, and an insulating film region 38b not implanted with ions.

Figure 3F:
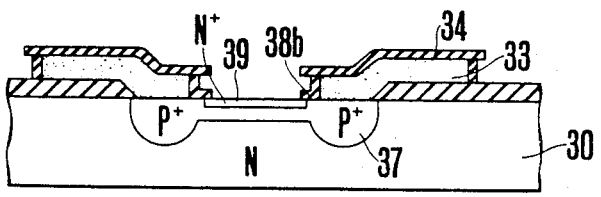

Then, these insulating film regions are etched. The etching speed of the ion-implanted insulating film is larger than that of the film not implanted with ions. This fact has already been pointed out in connection with the previous embodiment. For this reason, as shown in FIG. 3F, when the ion-implanted insulating film regions are completely removed, the periphery of the opening of the boron doped polycrystalline silicon layer which acts as the base electrode is covered by the insulating film.

Then an emitter $N^+$ region 39 is formed by conventional vapor phase diffusion method or ion implantation method. Thereafter, the steps shown in the first embodiment are followed to form an opening for the base contact and electrode metal is vapor-deposited to form emitter and base electrodes.

Figure 4A:
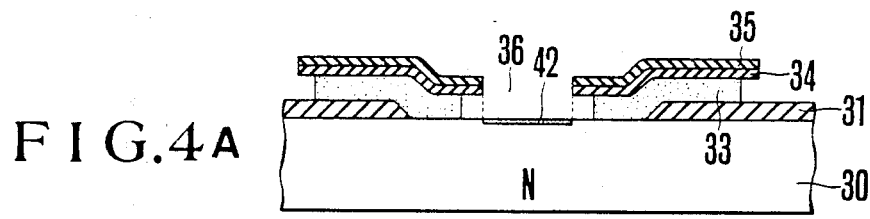
FIGS. 4A through 4C are sectional views showing certain steps of another embodiment of the method of manufacturing a bipolar transistor.
Figure 4B:
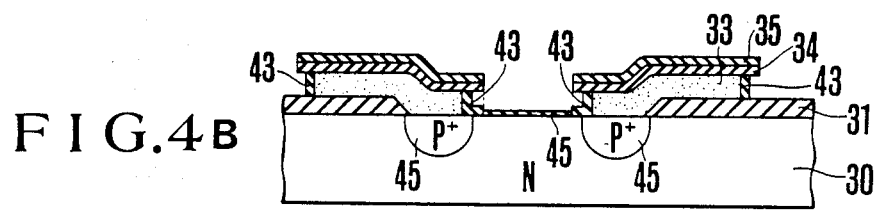
Figure 4C:
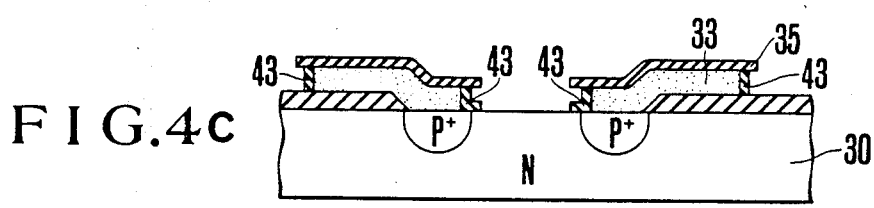

The steps shown in FIGS. 3D throug 3F may be identical to those of the first embodiment, and such steps are shown by FIGS. 4A through 4C. More particularly, after forming the base diffusion opening 36 by the step shown in FIG. 3C, a region 42 implanted with nitrogen ions is formed by using oxide films 34 and 35 as a mask, as shown in FIG. 4A.

Then, when heat oxidation is performed, since the oxidation speed of the nitrogen implanted region 42 is slower than that of the region not implanted with nitrogen, the thickness of the silicon oxide film 43 at the non-implanted portion increases before the implanted regions 42 are perfectly oxidized. FIG. 4B shows this state. 45 shows an oxide film formed on the region 42 by the oxidation treatment. At the portion of the polycrystalline silicon layer in contact with the substrate 30, the impurity in the boron doped polycrystalline silicon layer 33 diffuses into the substrate to form a P+ region.

Then the oxide films 35 and 45 at the ion-implanted portion are removed by etching to obtain a structure shown in FIG. 4C. Therearter the steps of base diffusion and emitter diffusion are carried out to obtain the structure shown in FIG. 3F.

Figure 5:
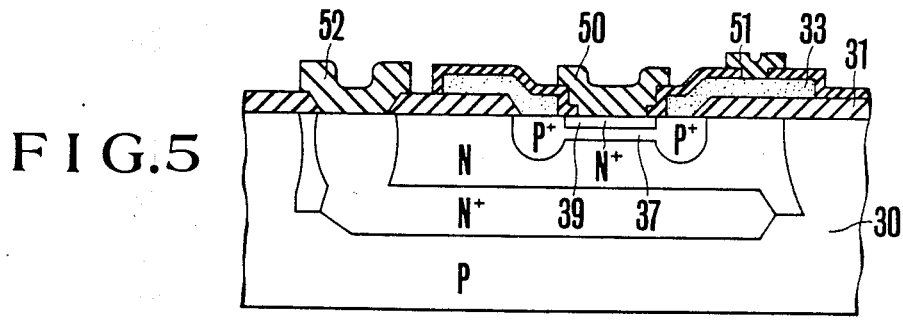
FIG. 5 is a sectional view showing transistor of this invention suitable for fabricating an integrated circuit.
Figure 6A:
FIGS. 6A through 6F are plan views showing typical configurations of the base region or the emitter region of a bipolar transistor embodying the invention.
Figure 6B:
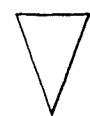
Figure 6C:
Figure 6D:
Figure 6E:
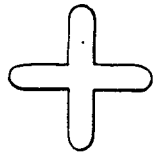
Figure 6F:

FIG. 5 shows an application of this invention to a transistor suitable for incorporation into an integrated circuit, in which reference charactors 50, 51 and 52 show emitter, base and collector electrodes respectively. The other elements are identical to those shown in FIG. 3F. Although this example relates to a P-N isolation type, the invention is also applicable to dielectric isolation type, for example, aisoplanar.

It should be understood that the invention is not limited to the specific embodiments described above and that many changes and modifications can be made. For example, instead of NPN type transistors, PNP type transistors can also be manufactured.

What is claimed is:

1. A planar type bipolar transistor with a vertical transistor structure comprising:
    a collector region of a first conductivity type;
    an insulating layer formed on said collector region and defining an opening to said collector region;
    a base region formed in said collector region at said opening and having an impurity of a second conductivity type opposite said first conductivity type, said base region having a periphery;
    a base contact region provided at and contacting the entire periphery of said base region, said base contact region containing an impurity of said second conductivity type in higher concentration than the concentration of impurity in said base region;
    an emitter region of said first conductivity type disposed as an island in said base region and having an outer peripheral edge portion abutting said base region at an emitter-base junction having a top planar side and circumscribing said emitter region;
    a base electrode of polycrystalline silicon containing an impurity of said second conductivity type formed in contact with said base contact region and extending onto said insulating layer, said base electrode having an inner peripheral edge portion spaced from and circumscribing said emitter region;
    an emitter electrode in contact with said emitter region and having an outer peripheral edge portion; and
    an insulating film covering and contacting at least the inner peripheral edge portion of said base electrode and extending outwardly therefrom onto said base electrode, said insulating film circumscribing and contacting the entire outer peripheral edge portion of said emitter electrode and covering and contacting the top planar side of the emitter-base junction for electrically isolating said base electrode from said emitter electrode;
    wherein said base electrode contacts said base contact region along a band of constant width, said band having an inner circumference circumscribing said emitter region and spaced from the outer peripheral edge of said emitter region by a constant distance everywhere along the length of the band.

2. A bipolar transistor according to claim 1 wherein said insulating layer consists of first and second layers, said first layer being the layer onto which the base electrode extends, said first layer containing an impurity of said second type conductivity.

3. A bipolar transistor according to claim 1 wherein said insulating film isolating the base and emitter electrodes includes an oxide film materialized by oxidation of the base polycrystalline electrode region that protects the surface of the emitter-base junction.

4. A bipolar transistor according to claim 1 wherein said emitter electrode is made of polycrystalline silicon containing an impurity of said first conductivity type and metal disposed thereupon.

5. A bipolar transistor according to claim 1 wherein said collector region comprises N-type monocrystalline silicon.

6. A bipolar transistor according to claim 1 wherein said insulating layer is provided with another opening and includes:
    a collector-complementing region containing an impurity of said first conductivity type in said higher concentration and extending from underneath said collector region to said other opening; and
    a collector electrode in contact with said collector complementing region through said other opening.

* * * * *